(12) United States Patent
Kalnitsky et al.

(10) Patent No.: US 11,730,058 B2
(45) Date of Patent: Aug. 15, 2023

(54) INTEGRATED HEATER (AND RELATED METHOD) TO RECOVER DEGRADED PIEZOELECTRIC DEVICE PERFORMANCE

(71) Applicant: Taiwan Semiconductor Manufacturing Co., Ltd., Hsin-Chu (TW)

(72) Inventors: Alexander Kalnitsky, San Francisco, CA (US); Chun-Ren Cheng, Hsin-Chu (TW); Chi-Yuan Shih, Hsinchu (TW); Kai-Fung Chang, Taipei (TW); Shih-Fen Huang, Jhubei (TW); Yi-Chuan Teng, Zhubei (TW); Yi Heng Tsai, Hsinchu (TW); You-Ru Lin, New Taipei (TW); Yan-Jie Liao, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1030 days.

(21) Appl. No.: 16/413,839

(22) Filed: May 16, 2019

(65) Prior Publication Data

US 2020/0098969 A1  Mar. 26, 2020

Related U.S. Application Data

(60) Provisional application No. 62/734,090, filed on Sep. 20, 2018.

(51) Int. Cl.
| | | |
|---|---|---|
| *H01L 41/193* | (2006.01) | |
| *H01L 41/08* | (2006.01) | |
| *H01L 41/113* | (2006.01) | |
| *D01F 6/62* | (2006.01) | |
| *H10N 30/00* | (2023.01) | |
| *H10N 30/04* | (2023.01) | |
| *H10N 30/067* | (2023.01) | |
| *H10N 30/87* | (2023.01) | |
| *H10N 30/063* | (2023.01) | |

(52) U.S. Cl.
CPC ....... *H10N 30/10513* (2023.02); *H10N 30/04* (2023.02); *H10N 30/067* (2023.02); *H10N 30/877* (2023.02); *H10N 30/063* (2023.02)

(58) Field of Classification Search
CPC ... H01L 41/081; H01L 41/293; H01L 41/297; H01L 41/0477
USPC ........................................................ 310/311
See application file for complete search history.

(56) References Cited

U.S. PATENT DOCUMENTS

| | | | | |
|---|---|---|---|---|
| 2014/0303452 A1* | 10/2014 | Ghaffari | ................. | A61B 18/14 601/3 |
| 2016/0087552 A1* | 3/2016 | Kim | ......................... | H02N 1/04 310/310 |
| 2020/0244222 A1* | 7/2020 | Umeda | ................ | H03H 9/1057 |

* cited by examiner

*Primary Examiner* — Shawki S Ismail
*Assistant Examiner* — Monica Mata
(74) *Attorney, Agent, or Firm* — Eschweiler & Potashnik, LLC

(57) ABSTRACT

In some embodiments, a piezoelectric device is provided. The piezoelectric device includes a semiconductor substrate. A first electrode is disposed over the semiconductor substrate. A piezoelectric structure is disposed on the first electrode. A second electrode is disposed on the piezoelectric structure. A heating element is disposed over the semiconductor substrate. The heating element is configured to heat the piezoelectric structure to a recovery temperature for a period of time, where heating the piezoelectric structure to the recovery temperature for the period of time improves a degraded electrical property of the piezoelectric device.

20 Claims, 10 Drawing Sheets

INTEGRATED HEATER (AND RELATED METHOD) TO RECOVER DEGRADED PIEZOELECTRIC DEVICE PERFORMANCE

REFERENCE TO RELATED APPLICATION

This Application claims the benefit of U.S. Provisional Application No. 62/734,090, filed on Sep. 20, 2018, the contents of which are hereby incorporated by reference in their entirety.

BACKGROUND

Piezoelectric devices (e.g., piezoelectric actuators, piezoelectric sensors, etc.) are used in many modern day electronic devices (e.g., automotive sensors/actuators, aerospace sensors/actuators, etc.). One example of a piezoelectric device is a piezoelectric actuator. A piezoelectric actuator can be utilized to create a physical movement that exerts a force on a physical part in a system under the control of an electrical signal. The physical movement generated by the piezoelectric actuator can be utilized to control various kinds of systems (e.g., mechanical systems, optical systems, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
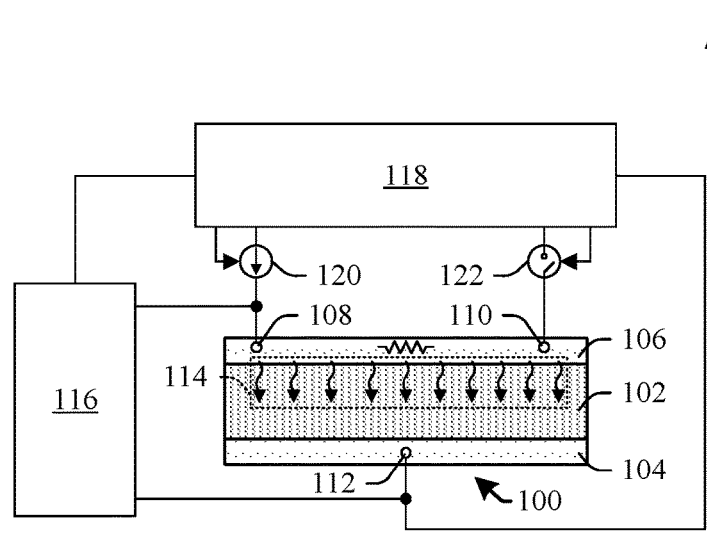
FIG. 1 illustrates a view of some embodiments of a system comprising a piezoelectric device configured to recover a degraded performance characteristic of the piezoelectric device.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some piezoelectric devices include a piezoelectric structure disposed between a first electrode and a second electrode. When a voltage is applied between the first electrode and the second electrode, an electrical field generated by the applied voltage can cause the piezoelectric structure to change from a first shape to a second shape. This change in shape can be used to control various kinds of systems (e.g., mechanical systems, optical systems, etc.).

A challenge with the above piezoelectric device is degraded piezoelectric device performance. The device performance of a piezoelectric device may degrade due to one or more performance characteristics (e.g., capacitance, polarization, piezo-actuation, etc.) of the piezoelectric device falling out of specification. Negative effects (e.g., imprint effect, fatigue effect, etc.) caused by operating conditions of the piezoelectric device (e.g., consecutive unipolar bias pulses, amount of Q-time, length of time locked in a domain, number of times switched between lockable domains, etc.) may result in the one or more performance characteristics degrading out of specification. Further, fabrication process(es) (e.g., thermal process(es), electrical testing process(es), etc.) utilized to form the piezoelectric device may cause the one or more performance characteristics to degrade out of specification.

In various embodiments, the present application is directed toward a method for recovering degraded device performance of a piezoelectric device. The method includes determining a performance characteristic of a piezoelectric device has degraded from a first value to a second value, where the piezoelectric device comprises a piezoelectric structure disposed over a semiconductor substrate. Once it is determined that the performance characteristic has degraded, a recovery mode operation is performed. The recovery mode operation comprises heating the piezoelectric structure to a recovery temperature for a period of time by selectively passing a current through a heating element that is disposed over the semiconductor substrate. After the temperature of the piezoelectric device is at the recovery temperature for the period of time, the performance characteristic of the piezoelectric device may improve from the second value to a third value that is closer to the first value than the second value is to the first value. Accordingly, the performance characteristic of the piezoelectric device that has degraded from the first value to the second value may be improved to the third value, thereby recovering the degraded device performance of the piezoelectric device.

FIG. 1 illustrates a view of some embodiments of a system 101 comprising a piezoelectric device 100 configured to recover a degraded performance characteristic of the piezoelectric device 100.

As shown in FIG. 1, the piezoelectric device 100 comprises a piezoelectric structure 102 disposed between a first electrode 104 and a second electrode 106. In some embodiments, the piezoelectric structure comprises a piezoelectric material. In further embodiments, the second electrode 106 is a heating element (illustrated by a resistor circuit symbol). The heating element is configured to generate heat 114 (e.g., via resistive heating) that emanates toward the piezoelectric structure 102. In further embodiments, a first terminal 108 is electrically coupled to the second electrode 106 at a first location, and a second terminal 110 is electrically coupled to the second electrode 106 at a second location different than the first location. In yet further embodiments, a third terminal 112 is electrically coupled to the first electrode 104.

In some embodiments, bias circuitry 118 is electrically coupled to the first terminal 108, the second terminal 110, and the third terminal 112. The bias circuitry 118 is configured to provide bias voltages to the first terminal 108, the second terminal 110, and/or the third terminal 112. In further embodiments, a current source 120 is electrically coupled to the first terminal 108 and the bias circuitry 118. In further embodiments, the bias circuitry 118 is configured to control an amount of current output by the current source 120 (e.g., by providing an electrical signal to the current source 120). In further embodiments, a switching element 122 is electrically coupled to the second terminal 110 and the bias circuitry 118. In further embodiments, the bias circuitry 118 is configured to switch the switching element 122 between an open state and a closed state (e.g., by providing an electrical signal to the switching element 122). In yet further embodiments, the bias circuitry 118 may comprise the switching element 122 and/or the current source 120.

In some embodiments, the switching element 122 is a transistor (e.g., a metal-oxide-semiconductor field-effect transistor (MOSFET)). In further embodiments, when the switching element 122 is in the closed state, the second terminal 110 may be electrically coupled to a low-potential node (e.g., ground). In yet further embodiments, when the switching element 122 is in the open state, the second terminal 110 may be coupled to a floating node.

In some embodiments, measurement circuitry 116 is electrically coupled to the first terminal 108 (or the second terminal 110) and the third terminal 112. The measurement circuitry 116 is configured to measure one or more performance characteristics of the piezoelectric device 100. In some embodiments, the performance characteristic may be an electrical property of the piezoelectric device 100. In further embodiments, the one or more performance characteristics may be, for example, a capacitance of the piezoelectric device 100, a Q-time of the piezoelectric device 100 (e.g., a time in which no voltage bias is applied across the piezoelectric structure 102 and the switching element 122 is in the open state), polarization of the piezoelectric device 100, piezo-actuation performance of the piezoelectric device 100 (e.g., an amount of deformation of the piezoelectric structure 102), a defined operational time of the piezoelectric device 100, a defined time interval since the most recent operation of the piezoelectric device 100, some other electrical/mechanical property of the piezoelectric device 100, or a combination of the foregoing. In yet further embodiments, the measurement circuitry 116 is electrically coupled to the bias circuitry 118.

In some embodiment, the measurement circuitry 116, the piezoelectric device 100, and the bias circuitry 118 are disposed on a single integrate chip (IC). In other embodiments, the measurement circuitry 116 and/or the bias circuitry 118 may be disposed on an IC that is discrete from an IC that comprises the piezoelectric device 100. In yet other embodiments, the measurement circuitry 116, the piezoelectric device 100, and the bias circuitry 118 may be disposed on discrete ICs, respectively.

The piezoelectric device 100 is configured to operate in an actuation mode and a recovery mode. In some embodiments, when operating in the actuation mode, the piezoelectric device 100 may change a shape of the piezoelectric structure 102 from a first shape to a second shape different than the first shape (e.g., by changing a voltage across the piezoelectric structure 102). In further embodiments, when operating in the actuation mode, the piezoelectric device 100 may measure a change in the shape of the piezoelectric structure 102 caused by a force external to the piezoelectric device 100 (e.g., a pressure wave). In further embodiments, operating in the actuation mode may cause the one or more performance characteristic to degrade out of specification. In other embodiments, fabrication process(es) (e.g., thermal process(es), electrical testing process(es), etc.) utilized to form the piezoelectric device 100 may cause the performance characteristic to degrade out of specification.

For example, when operating in the actuation mode, the bias circuitry 118 may provide bias voltages to the first terminal 108 and the third terminal 112, respectively, to change the shape of the piezoelectric structure 102 from the first shape to the second shape. In some embodiments, during the actuation mode, the switching element 122 is in the open state, and the current source 120 is providing a first current to the first terminal 108. As the piezoelectric device 100 operates in the actuation mode, one of the performance characteristics may degrade over time.

In some embodiments, to determine if the one or more performance characteristics have degraded, the measurement circuitry 116 measures the one or more performance characteristics and compares the measurements to a degradation condition. For example, at a first time interval, the measurement circuitry 116 may measure that the one or more performance characteristics has a first value, and compares the first value to a degradation value to determine if the first value is less than the degradation value. If the first value is greater than the degradation value, the measurement circuitry 116 determines the one of the performance characteristics has not degraded. Thereafter, at a second time interval, the measurement circuitry 116 may measure that the one or more performance characteristics has a second value, and compares the second value to the degradation value to determine if the second value is less than the degradation value. If the second value is greater than the degradation value, the measurement circuitry 116 determines the one of the performance characteristics has degraded. In some embodiments, once a predetermined time interval (e.g., a number of second, minutes, hours, etc.) has passed, a determination is made that the one of the performance characteristics has degraded. In further embodiments, the measurement circuitry 116 measures the one or more performance characteristics while the piezoelectric device 100 is operating in the actuation mode.

Once the measurement circuitry 116 determines that one or more performance characteristics have degraded, a recovery mode operation is performed on the piezoelectric device 100. For example, if the measurement circuitry 116 determines that one or more performance characteristics have degraded, the measurement circuitry 116 provides an electrical signal to the bias circuitry 118 to initiate the recovery mode operation, such that the bias circuitry 118 may perform the recovery mode operation. In some embodiments, once the recovery mode operation is initiated, the piezoelectric device 100 is operating in the recovery mode.

The recovery mode operation is configured to recover the one or more degraded performance characteristics. The recovery mode operation comprises heating the piezoelectric structure 102 to a recovery temperature for a period of time. For example, the recovery mode operation comprises the switching element 122 being in the closed state, and the current source 120 providing a second current greater than the first current to the heating element (e.g., via the first terminal 108). Accordingly, the second current may pass through the heating element causing the heating element to generate heat 114 (e.g., via resistive heating) that emanates toward the piezoelectric structure 102, such that the heat 114 increases the temperature of the piezoelectric structure 102 to the recovery temperature. Thereafter, the current source 120 may reduce the second current to the first current, such that the temperature of the piezoelectric structure 102 may decrease from the recovery temperature. In some embodiments, the recovery temperature is about a Curie temperature of the piezoelectric material. In further embodiments, the period of time is less than about 1 second.

By heating the piezoelectric structure 102 to the recovery temperature for the period of time, the recovery mode operation may recover the degraded performance of the one or more performance characteristics. For example, after the recovery mode operation, the one of the performance characteristics may have a third value that is greater than the degradation value. Thus, the recovery mode operation may recover the one of the degraded performance characteristics. Accordingly, after the recovery mode operation, the piezoelectric device 100 may operate in the actuation mode with the one of the performance characteristics having the third value, thereby recovering degraded device performance of the piezoelectric device 100.

In some embodiments, after the recovery mode operation is completed, the measurement circuitry 116 measures the one or more performance characteristics to determine whether the recovery mode operation recovered the one or more degraded performance characteristics. For example, at a third time interval after the recovery mode operation is completed, the measurement circuitry 116 may measure that the one or more performance characteristics has the third value, and compares the third value to the degradation value. If the third value is greater than the degradation value (as it is in the above example), the measurement circuitry 116 may determine that the recover mode operation recovered the one of the degraded performance characteristics, and the measurement circuitry 116 may provide an electrical signal to the bias circuitry 118 to initiate the actuation mode. In other embodiments, if the third value is less than the degradation value, the measurement circuitry 116 may provide an electrical signal to the bias circuitry 118 to perform another recovery mode operation to recover the one of the degraded performance characteristics.

Figure 2:
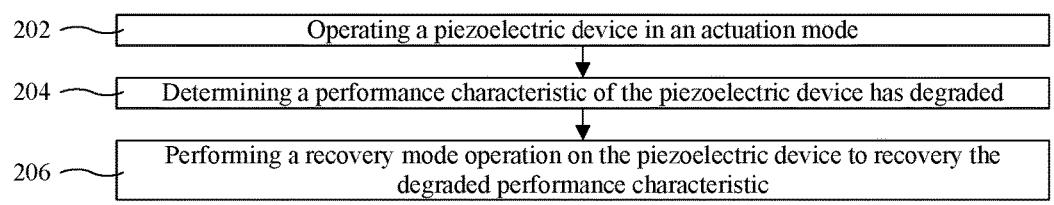
FIG. 2 illustrates a flowchart of some embodiments of a method for recovering a degraded performance characteristic of the piezoelectric device of FIG. 1.

As illustrated in FIG. 2, a flowchart 200 of some embodiments of a method for recovering a degraded performance characteristic of the piezoelectric device of FIG. 1 is provided. While the flowchart 200 of FIG. 2 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 202, a piezoelectric device is operated in an actuation mode. At act 204, it is determined that a performance characteristic of the piezoelectric device has degraded. At act 206, a recovery mode operation is performed on the piezoelectric device to recover the degraded performance characteristic. The above paragraphs corresponding to FIG. 1 describe some embodiments corresponding to acts 202, 204, and 206.

Figure 3:
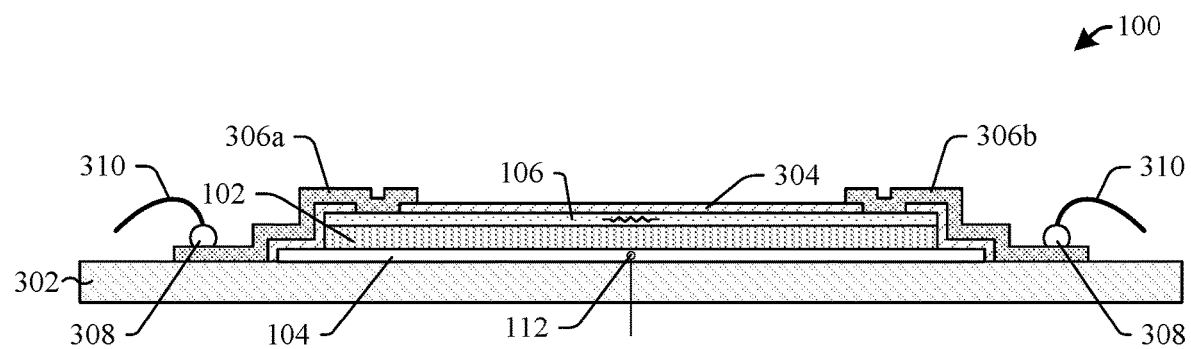
FIG. 3 illustrates a cross-sectional view of some embodiments of the piezoelectric device of FIG. 1.

FIG. 3 illustrates a cross-sectional view of some embodiments of the piezoelectric device 100 of FIG. 1.

As shown in FIG. 3, the first electrode 104 is disposed on a semiconductor substrate 302. In some embodiments, the semiconductor substrate 302 comprises any type of semiconductor body (e.g., monocrystalline silicon/CMOS bulk, silicon-germanium (SiGe), silicon on insulator (SOI), etc.). In further embodiments, the first electrode 104 is conductive and comprises, for example, tungsten, titanium nitride, tantalum nitride, aluminum, copper, gold, silver, some other conductive material, or a combination of the foregoing. In further embodiments, a thickness (e.g., a distance between an upper surface and a lower surface) of the first electrode 104 may be between about 10 angstrom (A) and about 100 A, about 100 A and about 1 kA, about 1 kA and about 1 micrometer (um), about 1 um and about 100 um, and about 100 um to about 1 millimeter (mm).

The piezoelectric structure 102 is disposed over the first electrode 104. The piezoelectric structure 102 is configured to generate an electric charge in response to a change in a shape of the piezoelectric structure 102, or vice versa. In some embodiments, the piezoelectric structure 102 comprises, for example, lead zirconate titanate, lithium niobate, gallium arsenide, zinc oxide, aluminum nitride, quartz single crystals, polymer-film piezoelectrics (e.g., polyvinylidene fluoride (PVDF)), some other piezoelectric material, or a combination of the foregoing. In further embodiments, a thickness of the piezoelectric structure 102 may be between about 10 A and about 100 A, about 100 A and about 1 kA, about 1 kA and about 1 um, about 1 um and about 100 um, and about 100 um to about 1 mm.

The second electrode 106 is disposed over the piezoelectric structure 102. In some embodiments, the second electrode 106 is the heating element (illustrated by a resistor circuit symbol). The heating element is configured to generate heat (e.g., via resistive heating) that emanates toward the piezoelectric structure 102. In further embodiments, the heating element may have an internal resistance between about 1 ohm and 100 ohms. In further embodiments, opposite sidewalls of the second electrode 106 are substantially aligned with opposite sidewalls of the piezoelectric structure 102. In further embodiments, the second electrode 106 is conductive and comprises, for example, tungsten, titanium nitride, tantalum nitride, aluminum, copper, gold, silver, some other conductive material, or a combination of the foregoing. In yet further embodiments, a thickness of the second electrode 106 may be between about 10 A and about 100 A, about 100 A and about 1 kA, about 1 kA and about 1 um, about 1 um and about 100 um, and about 100 um to about 1 mm.

In some embodiments, a first passivation layer 304 is disposed over the second electrode 106, the piezoelectric structure 102, the first electrode 104, and the semiconductor substrate 302. In further embodiments, the first passivation layer 304 extends from above the second electrode 106 to the semiconductor substrate 302 along sidewalls of the second electrode 106, the piezoelectric structure 102, and the first electrode 104. In further embodiments, the first passivation layer 304 is a dielectric and comprises, for example, an oxide (e.g., silicon dioxide ($SiO_2$)), a nitride (e.g., silicon nitride (SiN)), an oxy-nitride (e.g., silicon oxynitride ($SiO_xN_y$)), some other dielectric material, or a combination of the foregoing. In yet further embodiments, the first passivation layer 304 may have a thickness between about 10 A and about 100 A, about 100 A and about 1 kA, about 1 kA and about 1 um, about 1 um and about 100 um, and about 100 um to about 1 mm.

A first conductive pad 306a and a second conductive pad 306b are electrically coupled to the heating element (e.g., the second electrode 106). In some embodiments, the first conductive pad 306a corresponds to the first terminal 108 (see, e.g., FIG. 1). In further embodiments, the second conductive pad 306b corresponds to the second terminal 110 (see, e.g., FIG. 1). In further embodiments, the first conductive pad 306a contacts the second electrode 106 at a first location, and the second conductive pad 306b contacts the second electrode 106 at a second location spaced from the first location. In yet further embodiments, the first location is disposed closer to a first sidewall of the second electrode 106 than to a mid-point of the second electrode 106 (e.g., a point about evenly spaced from opposite sidewalls of the second electrode 106), and the second location is disposed closer to a second sidewall opposite the first sidewall than the mid-point of the second electrode 106.

In some embodiments, the first conductive pad 306a and the second conductive pad 306b comprise, for example, copper, aluminum, aluminum-copper, some other conductive material, or a combination of the foregoing. In further embodiments, between about 10 um and about 50 um, about 50 um and about 100 um, about 100 um and about 500 um, about 500 um and about 10 mm, about 10 mm and about 100 mm of the first conductive pad 306a contacts an upper surface of the heating element. In yet further embodiments, between about 10 um and about 50 um, about 50 um and about 100 um, about 100 um and about 500 um, about 500 um and about 10 mm, about 10 mm and about 100 mm of the second conductive pad 306b contacts the upper surface of the heating element.

In some embodiments, bond structures 308 (e.g., a solder ball) are disposed on the first conductive pad 306a and the second conductive pad 306b. The bond structures 308 are configured to electrically couple bond wires 310 to the first conductive pad 306a and the second conductive pad 306b, respectively. In some embodiments, the bond wires 310 are configured to provide an electrical connection between the piezoelectric device 100 and a semiconductor package that comprises the piezoelectric device 100. In some embodiments, the bond structures 308 are conductive and may comprise, for example, gold, copper, some other conductive material, or a combination of the foregoing. In further embodiments, the bond wires 310 are conductive and may comprise, for example, gold, copper, aluminum, silver, some other conductive material, or a combination of the foregoing. In yet further embodiments, the bond structures 308 and the bond wires 310 may be referred to as input/output (I/O) structures.

It will be appreciated that, in some embodiments, the first conductive pad 306a and/or the second conductive pad 306b may not physically contact the second electrode 106 (e.g., the heating element). In such embodiments, an interconnect structure (not shown) comprising a plurality of conductive features (e.g., lines, vias, contacts, etc.) may be electrically coupled to the second electrode 106. In further such embodiments, a first conductive feature of the interconnect structure may contact the second electrode 106 at the first location, and a second conductive feature of the interconnect structure may contact the second electrode 106 at the second location. In further such embodiments, the first conductive feature of the interconnect structure may correspond to the first terminal 108, and the second conductive feature of the interconnect structure may correspond to the second terminal 110. In yet further such embodiments, the measurement circuitry 116 (see, e.g., FIG. 1) and/or the bias circuitry 118 (see, e.g., FIG. 1) may be disposed on the semiconductor substrate 302.

It will further be appreciated that, in some embodiments, an additional conductive pad (not shown) or an additional conductive feature of the interconnect structure (not shown) is electrically coupled to the first electrode 104. In such embodiments, the additional conductive pad or the additional conductive feature of the interconnect structure may correspond to the third terminal 112.

Figure 4:
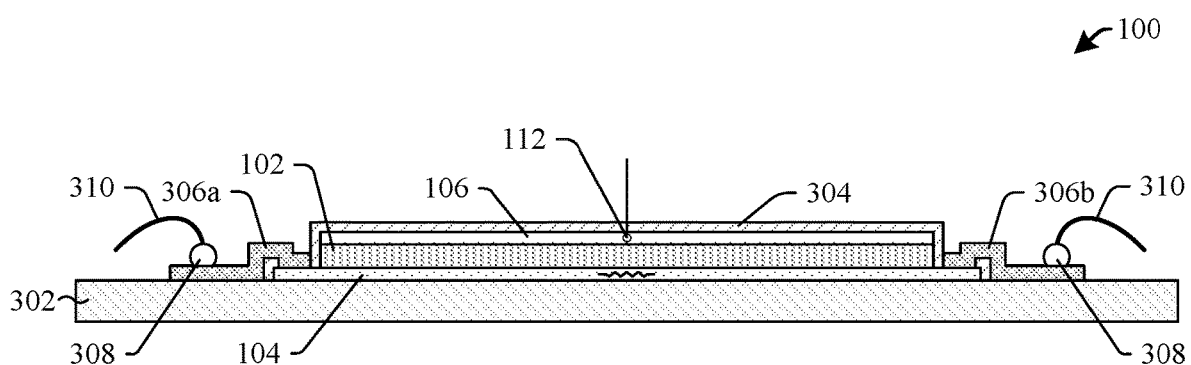
FIG. 4 illustrates a cross-sectional view of some other embodiments of the piezoelectric device of FIG. 1.

FIG. 4 illustrates a cross-sectional view of some other embodiments of the piezoelectric device 100 of FIG. 1.

As shown in FIG. 4, the first electrode 104 is the heating element (illustrated by a resistor circuit symbol). In some embodiments, the first conductive pad 306a contacts the first electrode 104 at a third location disposed between a first sidewall of the first electrode 104 and the piezoelectric structure 102. In further embodiments, the second conductive pad 306b contacts the first electrode 104 at a fourth location disposed between a second sidewall of the first electrode 104 opposite the first sidewall of the first electrode 104 and the piezoelectric structure 102.

Figure 5A:
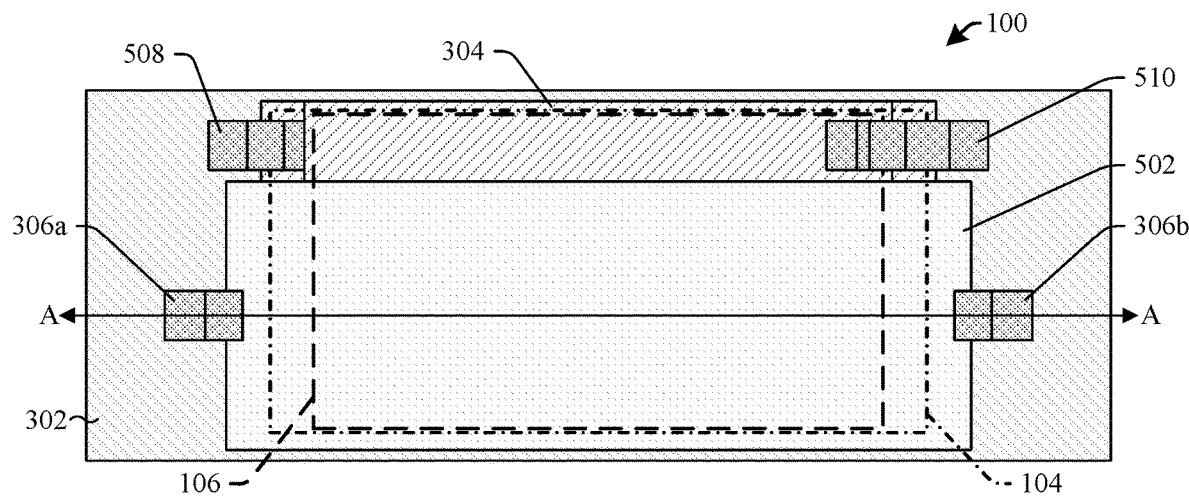
FIGS. 5A-5B illustrate various views of some other embodiments of the piezoelectric device of FIG. 1.
Figure 5B:
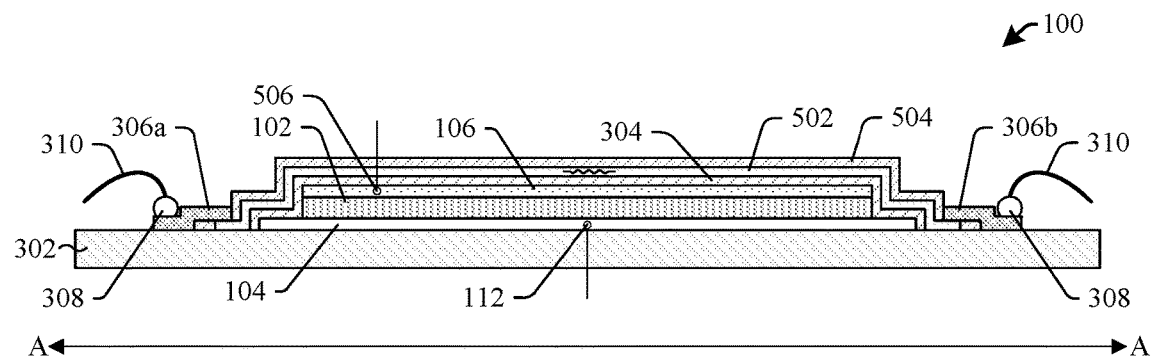

FIGS. 5A-5B illustrate various views of some other embodiments of the piezoelectric device 100 of FIG. 1. FIG. 5A illustrates a top view of the some other embodiments of the piezoelectric device 100 of FIG. 1. FIG. 5B illustrates a cross-sectional view taken along line A-A of FIG. 5A.

As shown in FIGS. 5A-5B, a heating structure 502 is disposed over and along sidewalls of the first passivation layer 304. In some embodiments, the heating structure 502 is the heating element (illustrated by a resistor circuit symbol). In further embodiments, the heating structure 502 conformally lines the first passivation layer 304. In yet further embodiments, the first passivation layer 304 electrically isolates the heating structure 502 from the first electrode 104 and the second electrode 106.

In some embodiments, the heating structure 502 may have a polygonal shaped (e.g., a rectangular shaped) layout. It will be appreciated that, in other embodiments, the heating structure 502 may have a different geometrically shaped layout (e.g., elliptical, circular, etc.). In further embodiments, the heating structure 502 is conductive and comprises, for example, tungsten, titanium nitride, tantalum nitride, aluminum, copper, gold, silver, some other conductive material, or a combination of the foregoing. In yet further embodiments, a thickness of the heating structure 502 may be between about 10 A and about 100 A, about 100 A and about 1 kA, about 1 kA and about 1 um, about 1 um and about 100 um, and about 100 um to about 1 mm.

In some embodiments, a second passivation layer 504 is disposed over and along sidewalls of the heating structure 502. In further embodiments, the second passivation layer 504 is a dielectric and comprises, for example, an oxide (e.g., $SiO_2$), a nitride (e.g., SiN), an oxy-nitride (e.g., $SiO_XN_Y$), some other dielectric material, or a combination of the foregoing. In yet further embodiments, the second passivation layer 504 may have a thickness between about 10 A and about 100 A, about 100 A and about 1 kA, about 1 kA and about 1 um, about 1 um and about 100 um, and about 100 um to about 1 mm.

In some embodiments, the first conductive pad 306a contacts the heating structure 502 at a fifth location disposed between a first sidewall of the second passivation layer 504 and a first outermost sidewall of the heating structure 502. In further embodiments, the second conductive pad 306b contacts the heating structure at a sixth location disposed between a second sidewall of the second passivation layer 504 opposite the first sidewall of the second passivation layer 504 and a second outermost sidewall of the heating structure 502 opposite the first outermost sidewall of the heating structure 502.

In some embodiments, a third conductive pad 508 is electrically coupled to the first electrode 104. In some embodiments, the third conductive pad 508 corresponds to the third terminal 112. In further embodiments, the third conductive pad 508 is electrically isolated from the heating structure 502, the first electrode 104, and the second electrode 106. In further embodiments, the first passivation layer 304 may electrically isolate the third conductive pad 508 from the first electrode 104 and the second electrode 106. In further embodiments, the second passivation layer 504 may electrically isolate the third conductive pad 508 from the heating structure 502. In further embodiments, the third conductive pad 508 comprises, for example, copper, aluminum, copper-aluminum, some other conductive material, or a combination of the foregoing. In yet further embodiments, between about 10 um and about 50 um, about 50 um and about 100 um, about 100 um and about 500 um, about 500 um and about 10 mm, about 10 mm and about 100 mm of the third conductive pad 508 may contact an upper surface of the first electrode 104.

In some embodiments, a fourth conductive pad 510 is electrically coupled to the second electrode 106. In some embodiments, the fourth conductive pad 510 corresponds to a fourth terminal 506. In further embodiments, the fourth terminal 506 may electrically couple the measurement circuitry 116 (see, e.g., FIG. 1) and/or the bias circuitry 118 (see, e.g., FIG. 1) to the second electrode 106, such that the measurement circuitry 116 may measure one or more performance characteristics of the piezoelectric device 100 and/or the bias circuitry 118 may provide bias voltages to the fourth terminal 506.

In some embodiments, the fourth conductive pad 510 is electrically isolated from the heating structure 502, the first electrode 104, and the second electrode 106. In further embodiments, the first passivation layer 304 may electrically isolate the fourth conductive pad 510 from the first electrode 104 and the second electrode 106. In further embodiments, the second passivation layer 504 may electrically isolate the fourth conductive pad 510 from the heating structure 502. In further embodiments, the fourth conductive pad 510 comprises, for example, copper, aluminum, aluminum-copper, some other conductive material, or a combination of the foregoing. In yet further embodiments, between about 10 um and about 50 um, about 50 um and about 100 um, about 100 um and about 500 um, about 500 um and about 10 mm, about 10 mm and about 100 mm of the fourth conductive pad 510 may contact an upper surface of the second electrode 106.

It will be appreciated that, in some embodiments, the third conductive pad 508 may not physically contact the first electrode 104, and/or the fourth conductive pad 510 may not physically contact the second electrode 106. In such embodiments, an interconnect structure (not shown) comprising a plurality of conductive features (e.g., lines, vias, contacts, etc.) may be electrically coupled to the first electrode 104 and/or the second electrode 106. In further such embodiments, a third conductive feature of the interconnect structure may contact the first electrode 104, and/or a fourth conductive feature of the interconnect structure may contact the second electrode 106. In further such embodiments, the third conductive feature may correspond to the third terminal 112, and/or the fourth conductive feature may correspond to the fourth terminal 506. In yet further such embodiments, the measurement circuitry 116 (see, e.g., FIG. 1) and/or the bias circuitry 118 (see, e.g., FIG. 1) may be disposed on the semiconductor substrate 302.

Figure 6:
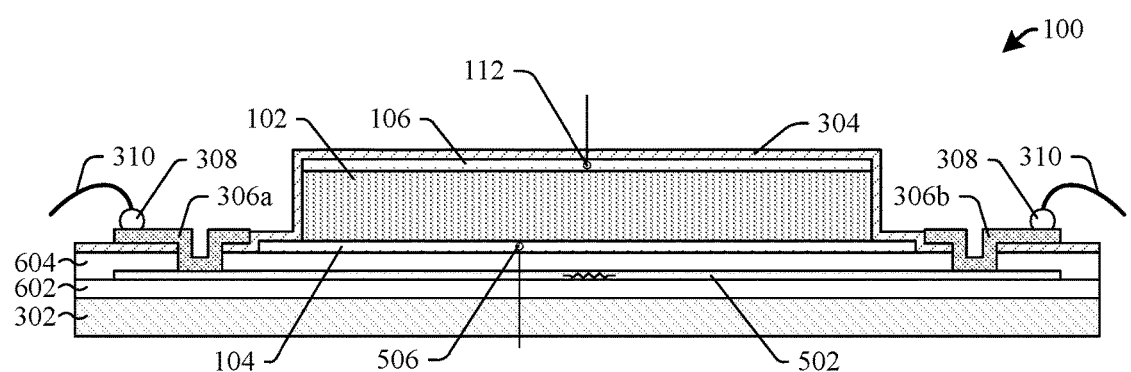
FIG. 6 illustrates a cross-sectional view of some other embodiments of the piezoelectric device of FIG. 1.

FIG. 6 illustrates a cross-sectional view of some other embodiments of the piezoelectric device 100 of FIG. 1.

As shown in FIG. 6, the heating structure 502 is disposed beneath the first electrode 104. In some embodiments, the heating structure 502 is disposed on a first interlayer dielectric (ILD) layer 602. In further embodiments, a second ILD layer 604 is disposed on the heating structure 502 and the first ILD layer 602. In yet further embodiments, the first ILD layer 602 and the second ILD layer 604 are dielectrics and comprise, for example, one or more of a low-k dielectric layer (e.g., a dielectric with a dielectric constant less than about 3.9), an ultra-low-k dielectric layer, an oxide (e.g., $SiO_2$), some other dielectric material, or a combination of the foregoing.

In some embodiments, the first conductive pad 306a may extend through the first passivation layer 304 and the second ILD layer 604 to contact the heating structure at a seventh location. In such embodiments, the seventh location may be disposed between the first outermost sidewall of the heating structure 502 and the first electrode 104. In further embodiments, the second conductive pad 306b may extend through the first passivation layer 304 and the second ILD layer 604 to contact the heating structure at an eight location. In such embodiments, the eighth location may be disposed between the second outermost sidewall of the heating structure 502 and the first electrode 104. In yet further embodiments, the first conductive pad 306a and/or the second conductive pad 306b may have upper surfaces that are disposed above an upper surface of the first passivation layer 304 that is disposed between an upper surface of the piezoelectric structure 102 and a bottom surface of the piezoelectric structure 102.

FIGS. 7-12 illustrate a series of cross-sectional views of some embodiments of a method for forming the piezoelectric device of FIG. 3.

Figure 7:
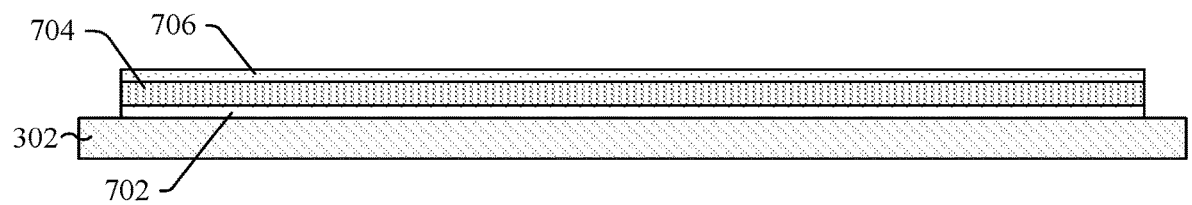
FIGS. 7-12 illustrate a series of cross-sectional views of some embodiments of a method for forming the piezoelectric device of FIG. 3.

As shown in FIG. 7, a first conductive layer 702 is formed over a semiconductor substrate 302. In some embodiments, the first conductive layer 702 may comprise, for example, tungsten, titanium nitride, tantalum nitride, aluminum, copper, gold, silver, some other conductive material, or a combination of the foregoing. In further embodiments, a thickness of the first conductive layer 702 may be between about 10 A and about 100 A, about 100 A and about 1 kA, about 1 kA and about 1 um, about 1 um and about 100 um, and about 100 um to about 1 mm. In further embodiments, the first conductive layer 702 may be formed by depositing the first conductive layer 702 onto the semiconductor substrate 302. In yet further embodiments, the first conductive layer 702 may be deposited by, for example, chemical vapor deposition (CVD), physical vapor deposition (PVD), atomic layer deposition (ALD), sputtering, electrochemical plating, electroless plating, some other deposition process, or a combination of the foregoing.

Also shown in FIG. 7, a piezoelectric layer 704 is formed over the first conductive layer 702. In some embodiments, the piezoelectric layer 704 comprises, for example, lead zirconate titanate, aluminum nitride, lithium niobate, gallium arsenide, zinc oxide, quartz single crystals, polymer-film piezoelectrics (e.g., PVDF), some other piezoelectric material, or a combination of the foregoing. In further embodiments, a thickness of the piezoelectric layer 704 may be between about 10 A and about 100 A, about 100 A and about 1 kA, about 1 kA and about 1 um, about 1 um and about 100 um, and about 100 um to about 1 mm. In further embodiments, the piezoelectric layer 704 may be formed by depositing the piezoelectric layer 704 onto the first conductive layer 702. In yet further embodiments, the piezoelectric layer 704 may be deposited by, for example, sputtering, a spin-on process, CVD, PVD, ALD, molecular-beam epitaxy, some other deposition process, or a combination of the foregoing.

Also shown in FIG. 7, a second conductive layer 706 is formed over the piezoelectric layer 704. In some embodiments, the second conductive layer 706 may comprise, for example, tungsten, titanium nitride, tantalum nitride, aluminum, copper, gold, silver, some other conductive material, or a combination of the foregoing. In further embodiments, a thickness of the second conductive layer 706 may be between about 10 A and about 100 A, about 100 A and about 1 kA, about 1 kA and about 1 um, about 1 um and about 100 um, and about 100 um to about 1 mm. In further embodiments, the second conductive layer 706 may be formed by depositing the second conductive layer 706 onto the piezoelectric layer 704. In yet further embodiments, the second conductive layer 706 may be deposited by, for example, CVD, PVD, ALD, sputtering, electrochemical plating, electroless plating, some other deposition process, or a combination of the foregoing.

Figure 8:
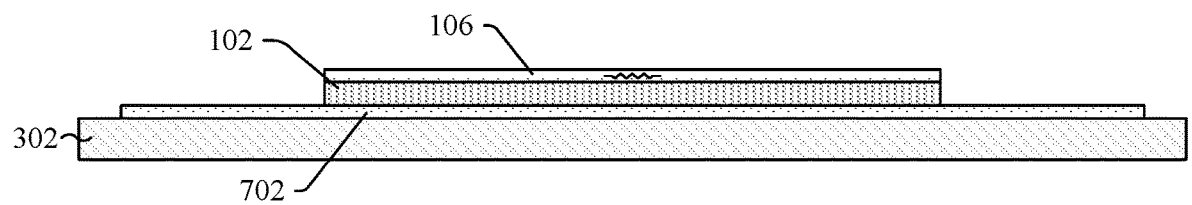

As shown in FIG. 8, a piezoelectric structure 102 is formed over the first conductive layer 702. Further, a second electrode 106 is formed over the piezoelectric structure 102. In some embodiments, a process for forming the piezoelectric structure 102 and the second electrode 106 comprises forming a first masking layer (not shown) (e.g., positive/negative photoresist) on the second conductive layer 706 (see, e.g., FIG. 7). The second conductive layer 706 is then exposed to a first etchant that removes unmasked portions of the second conductive layer 706, thereby forming the second electrode 106. In some embodiments, the first etchant also removes unmasked portions of the piezoelectric layer 704, thereby forming the piezoelectric structure 102. In other embodiments, after the second electrode 106 is formed, a second masking layer (not shown) is formed on the second electrode 106 (and/or portions of the piezoelectric layer 704). In such embodiments, the piezoelectric layer 704 is then exposed to a second etchant that removes unmasked portions of the piezoelectric layer 704, thereby forming the piezoelectric structure 102.

Figure 9:
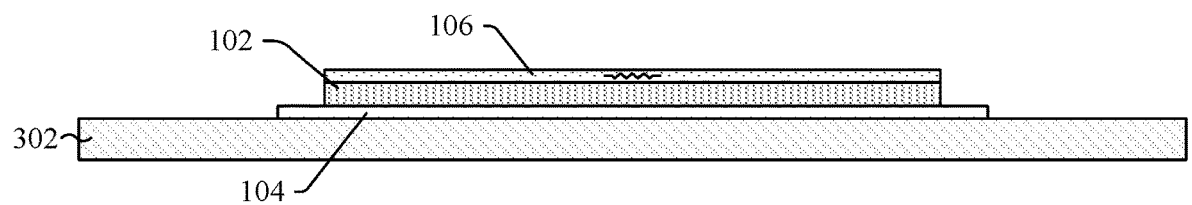

As shown in FIG. 9, a first electrode 104 is formed over the semiconductor substrate 302. In some embodiments, a process for forming the first electrode 104 comprises forming a masking layer (not shown) on the second electrode 106, the piezoelectric structure 102, and portions of the first conductive layer 702 (see, e.g., FIG. 7). The first conductive layer 702 is then exposed to an etchant that removes unmasked portions of the first conductive layer 702, thereby forming the first electrode 104.

Figure 10:
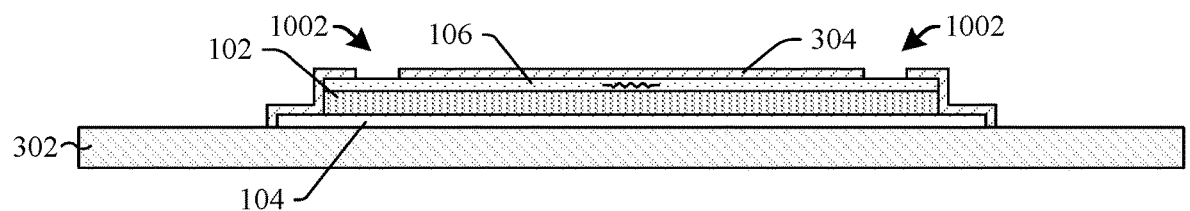

As shown in FIG. 10, a first passivation layer 304 is formed over the first electrode, 104, the piezoelectric structure 102, and the second electrode 106. In some embodiments, a process for forming the first passivation layer 304 comprises depositing or growing a dielectric layer (not shown) on the semiconductor substrate 302, the first electrode 104, the piezoelectric structure 102, and the second electrode 106. In some embodiments, the dielectric layer may be deposited or grown by, for example, CVD, PVD, ALD, thermal oxidation, sputtering, some other deposition or growth process, or a combination of the foregoing. In further embodiments, the dielectric layer may be deposited or grown as a conformal layer.

Thereafter, a masking layer (not shown) is formed on the dielectric layer. The dielectric layer is then exposed to an etchant that removes unmasked portions of the dielectric layer, thereby forming the first passivation layer 304. In further embodiments, the process for forming the first passivation layer 304 also forms a plurality of first openings 1002 over the second electrode 106. In yet further embodiments, the plurality of first openings 1002 are defined by sidewalls of the first passivation layer 304 and upper surfaces of the second electrode 106.

Figure 11:
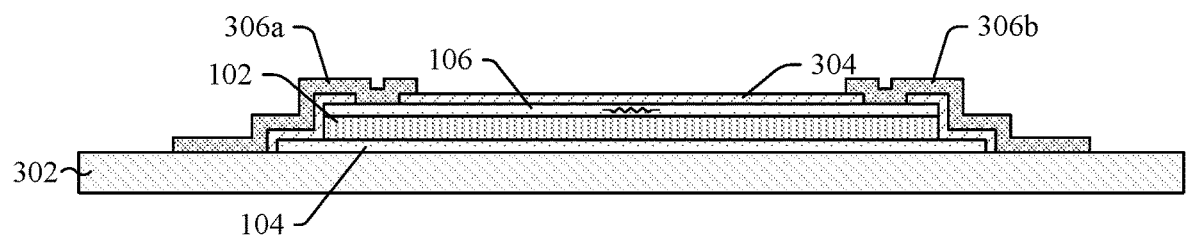

As shown in FIG. 11, a first conductive pad 306a and a second conductive pad 306b are formed over the first passivation layer 304 and the second electrode 106. In some embodiments, a process for forming the first conductive pad 306a and the second conductive pad 306b comprises depositing a conductive layer on the semiconductor substrate 302, the first passivation layer 304, and portions of the second electrode 106 exposed by the plurality of first openings 1002 (see, e.g., FIG. 10). In further embodiments, the conductive layer may be deposited by, for example, CVD, PVD, ALD, sputtering, electrochemical plating, electroless plating, some other deposition process, or a combination of the foregoing. Thereafter, a masking layer (not shown) is formed on the conductive layer. The conductive layer is then exposed to an etchant that removes unmasked portions of the conductive layer, thereby forming the first conductive pad 306a and the second conductive pad 306b. It will be appreciated that, in some embodiments, additional conductive pads (e.g., a third conductive pad 508) may be formed at a same time (or a different time by a substantially similar process) as the first conductive pad 306a and the second conductive pad 306b.

Figure 12:
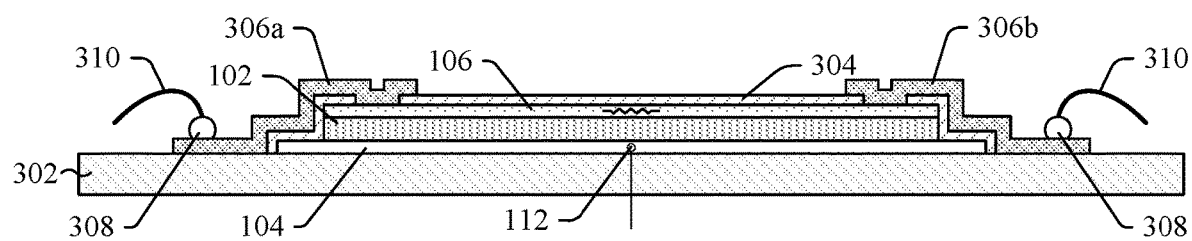

As shown in FIG. 12, bond structures 308 are formed on the first conductive pad 306a and the second conductive pad 306b. In addition, bond wires 310 are formed coupled to the bond structures 308, respectively. In some embodiments, a process for forming the bond structures 308 and the bond wires 310 comprises forming a ball-like structure (e.g., a free-air ball) at the end of a conductive wire, and then bonding the ball-like structure onto the first conductive pad 306a, thereby forming one of the bond structures 308 on the first conductive pad 306a. Thereafter, the conductive wire is drawn away from the one of the bond structures 308 and routed to a corresponding location over the semiconductor substrate 302 (e.g., a metal pad), thereby forming one of the bond wires 310 coupled to the one of the bond structures 308. This process may be repeated to form another one of the bond structures 308 on the second conductive pad 306b and another one of the bond wires 310 coupled to the another one of the bond structures 308.

FIGS. 13-22 illustrate a series of cross-sectional views of some embodiments of a method for forming the piezoelectric device of FIG. 6.

Figure 13:
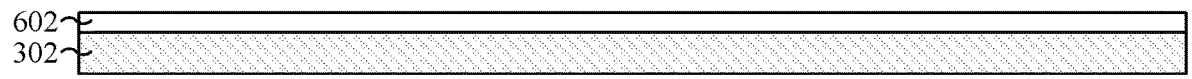
FIGS. 13-22 illustrate a series of cross-sectional views of some embodiments of a method for forming the piezoelectric device of FIG. 6.

As shown in FIG. 13, a first interlayer dielectric (ILD) layer 602 is formed over a semiconductor substrate 302. In some embodiments, a process for forming the first ILD layer 602 may comprise depositing or growing the first ILD layer 602 on the semiconductor substrate 302. In further embodiments, the first ILD layer 602 may be deposited or grown by, for example, CVD, PVD, ALD, thermal oxidation, sputtering, some other deposition or growth process, or a combination of the foregoing. In yet further embodiments, a planarization process (e.g., chemical-mechanical planarization (CMP)) may be performed on the first ILD layer 602 to form a substantially planar upper surface.

Figure 14:
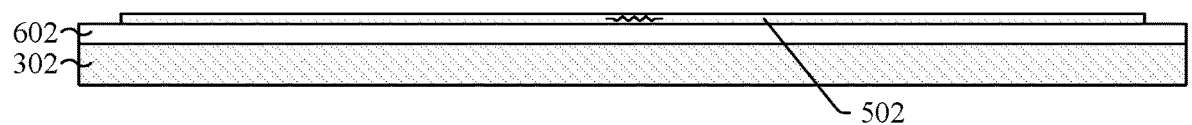

As shown in FIG. 14, a heating structure 502 is formed over the first ILD layer 602. In some embodiments, a process for forming the heating structure 502 comprises depositing a heating layer (not shown) onto the first ILD layer 602. In further embodiments, the heating layer is conductive and comprises, for example, tungsten, titanium nitride, tantalum nitride, aluminum, copper, gold, silver, some other conductive material, or a combination of the foregoing. In yet further embodiments, a thickness of the heating layer may be between about 10 A and about 100 A, about 100 A and about 1 kA, about 1 kA and about 1 um, about 1 um and about 100 um, and about 100 um to about 1 mm.

In some embodiments, the heating layer may be deposited by, for example, CVD, PVD, ALD, sputtering, electrochemical plating, electroless plating, some other deposition process, or a combination of the foregoing. In further embodiments, the heating layer may be deposited or grown as a conformal layer. Thereafter, a masking layer (not shown) is formed on the heating layer. In further embodiments, the heating layer is then exposed to an etchant that removes unmasked portions of the heating layer, thereby forming the heating structure 502. In yet further embodiments, a planarization process (e.g., CMP) may be performed on the heating structure 502 to form a substantially planar upper surface.

Figure 15:
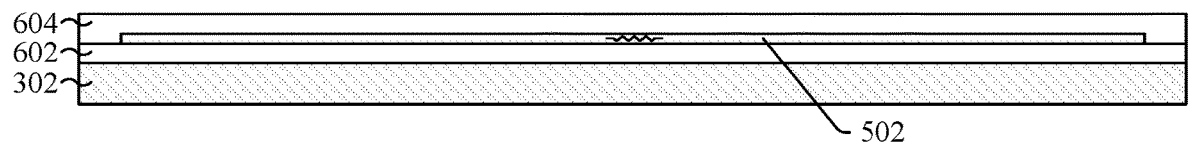

As shown in FIG. 15, a second ILD layer 604 is formed over the heating structure 502 and the first ILD layer 602. In some embodiments, a process for forming the second ILD layer 604 may comprise depositing the second ILD layer 604 on the heating structure 502 and the first ILD layer 602. In further embodiments, the second ILD layer 604 may be deposited by, for example, CVD, PVD, ALD, sputtering, some other deposition process, or a combination of the foregoing. In yet further embodiments, a planarization process (e.g., CMP) may be performed on the second ILD layer 604 to form a substantially planar upper surface.

Figure 16:
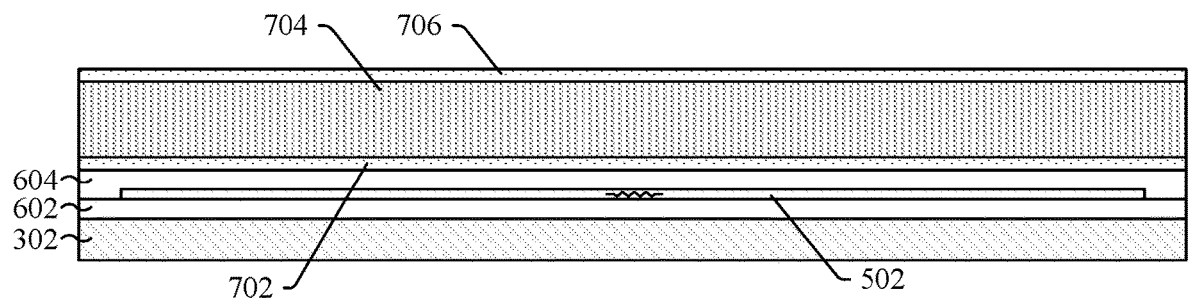

As shown in FIG. 16, a first conductive layer 702 is formed on the second ILD layer 604, a piezoelectric layer 704 is formed on the first conductive layer 702, and a second conductive layer 706 is formed on the piezoelectric layer 704. In some embodiments, a process for forming the first conductive layer 702 on the second ILD layer 604, forming the piezoelectric layer 704 on the first conductive layer 702, and forming the second conductive layer 706 is substantially similar to the process illustrated in FIG. 7 for forming the first conductive layer 702, the piezoelectric layer 704, and the second conductive layer 706.

Figure 17:
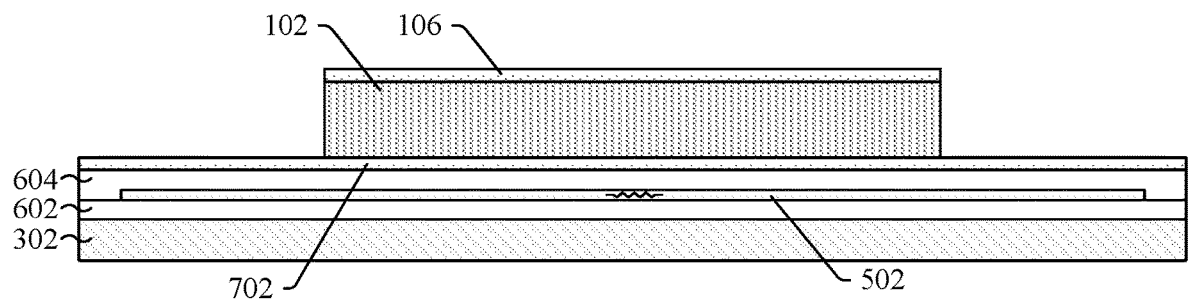

As shown in FIG. 17, a piezoelectric structure 102 is formed on the first conductive layer 702, and a second electrode 106 is formed on the piezoelectric structure 102. In some embodiments, a process for forming the piezoelectric structure 102 on the first conductive layer 702 and a process for forming the second electrode 106 on the piezoelectric structure 102 is substantially similar to the process illustrated in FIG. 8 for forming the piezoelectric structure 102 and the second electrode 106.

Figure 18:
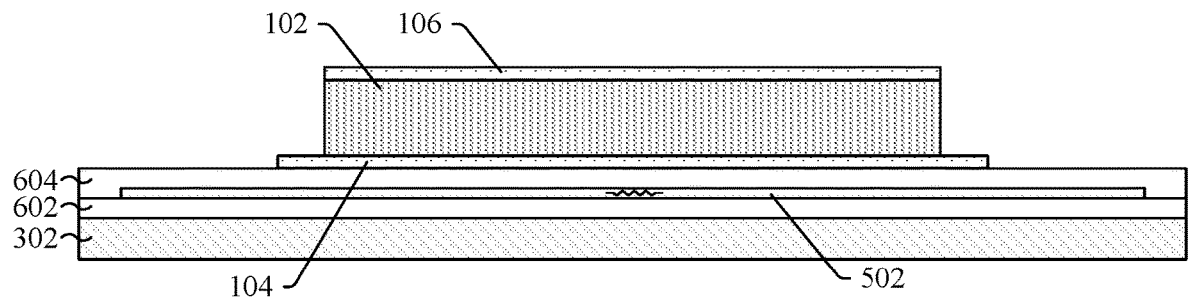

As shown in FIG. 18, a first electrode 104 is formed on the second ILD layer 604. In some embodiments, a process for forming the first electrode 104 on the second ILD layer 604 is substantially similar to the process illustrated in FIG. 9 for forming the first electrode 104.

Figure 19:
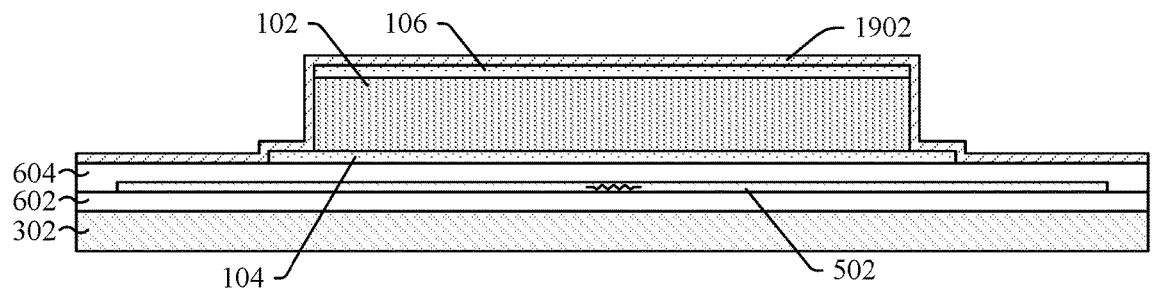

As shown in FIG. 19, a dielectric layer 1902 is formed over the second ILD layer 604, the first electrode 104, the piezoelectric structure 102, and the second electrode 106. In some embodiments, the dielectric layer 1902 comprises, for example, an oxide (e.g., silicon dioxide ($SiO_2$)), a nitride (e.g., silicon nitride (SiN)), an oxy-nitride (e.g., silicon oxynitride ($SiO_XN_Y$)), some other dielectric material, or a combination of the foregoing. In yet further embodiments, the dielectric layer 1902 may have a thickness between about 10 A and about 100 A, about 100 A and about 1 kA, about 1 kA and about 1 um, about 1 um and about 100 um, and about 100 um to about 1 mm.

In some embodiments, a process for forming the dielectric layer 1902 comprises depositing the dielectric layer 1902 onto the second ILD layer 604, the first electrode 104, the piezoelectric structure 102, and the second electrode 106. In some embodiments, the dielectric layer 1902 may be deposited by, for example, CVD, PVD, ALD, sputtering, some other deposition process, or a combination of the foregoing. In further embodiments, the dielectric layer 1902 may be deposited as a conformal layer.

Figure 20:
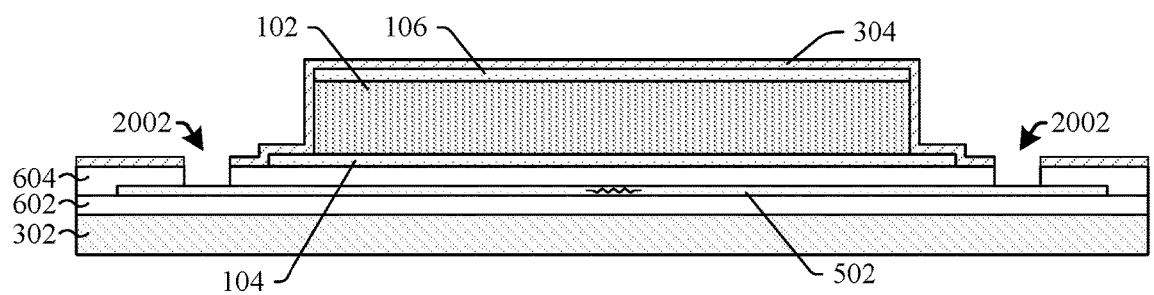

As shown in FIG. 20, a first passivation layer 304 is formed over the second ILD layer 604, the first electrode 104, the piezoelectric structure 102, and the second electrode 106. In some embodiments, a process for forming the first passivation layer 304 comprises depositing a masking layer (not shown) onto the dielectric layer 1902 (see, e.g., FIG. 19). The dielectric layer 1902 is then exposed to an etchant that removes unmasked portions of the dielectric layer 1902, thereby forming the first passivation layer 304.

In some embodiments, the process for forming the first passivation layer 304 also forms a plurality of second openings 2002 over the heating structure 502. In further embodiments, the plurality of second openings 2002 extend through the first passivation layer 304 and the second ILD layer 604 to the heating structure 502. In further embodiments, the plurality of second openings 2002 are formed on opposite sides of the first electrode 104. In yet further embodiments, the plurality of second openings 2002 are defined by sidewalls of the first passivation layer 304, sidewalls of the second ILD layer 604, and upper surfaces of the heating structure 502.

Figure 21:
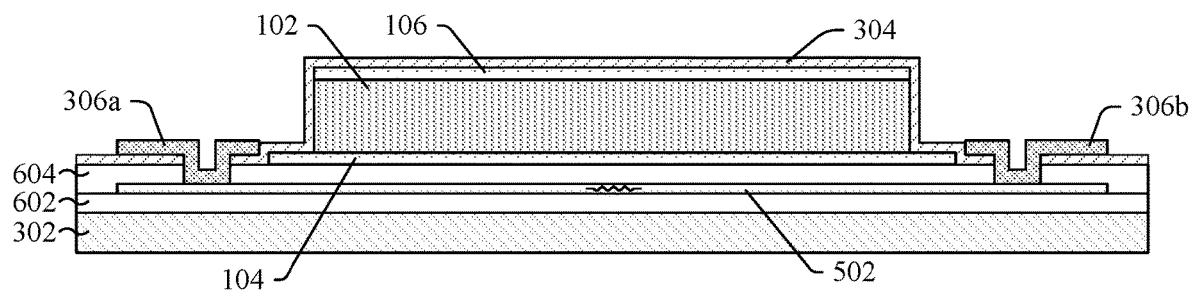

As shown in FIG. 21, a first conductive pad 306a and a second conductive pad 306b are formed on the first passivation layer 304 and the heating structure 502. In some embodiments, a process for forming the first conductive pad 306a and the second conductive pad 306b on the first passivation layer 304 and the heating structure 502 is substantially similar to the process illustrated in FIG. 11 for forming the first conductive pad 306a and the second conductive pad 306b. It will be appreciated that, in some embodiments, additional conductive pads (e.g., a third conductive pad 508 and a fourth conductive pad 510) may be formed at a same time (or a different time by a substantially similar process) as the first conductive pad 306a and the second conductive pad 306b.

Figure 22:
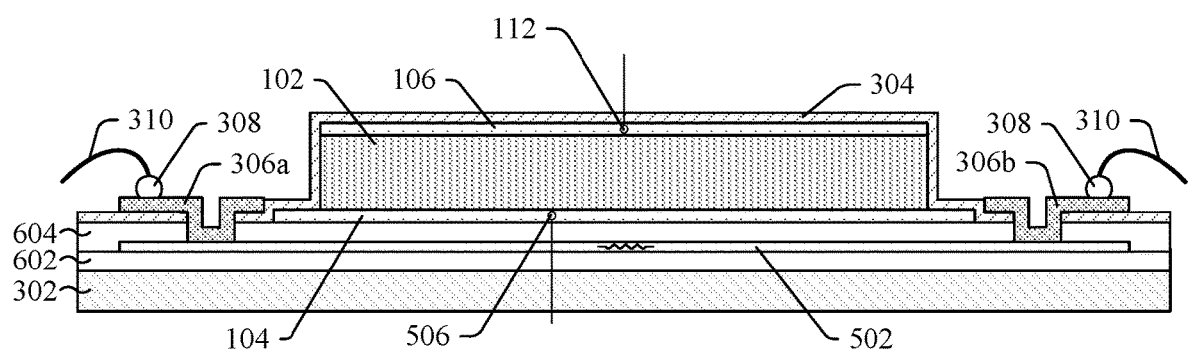

As shown in FIG. 22, bond structures 308 are formed on the first conductive pad 306a and the second conductive pad 306b. In addition, bond wires 310 are formed coupled to the bond structures 308, respectively. In some embodiments, a process for forming the bond structures 308 and the bond wires 310 is substantially similar to the process illustrated in FIG. 12 for forming the bond structures 308 and the bond wires 310. In further embodiments, the bond structures 308 and the bond wires 310 may be referred to as I/O structures.

Figure 23:
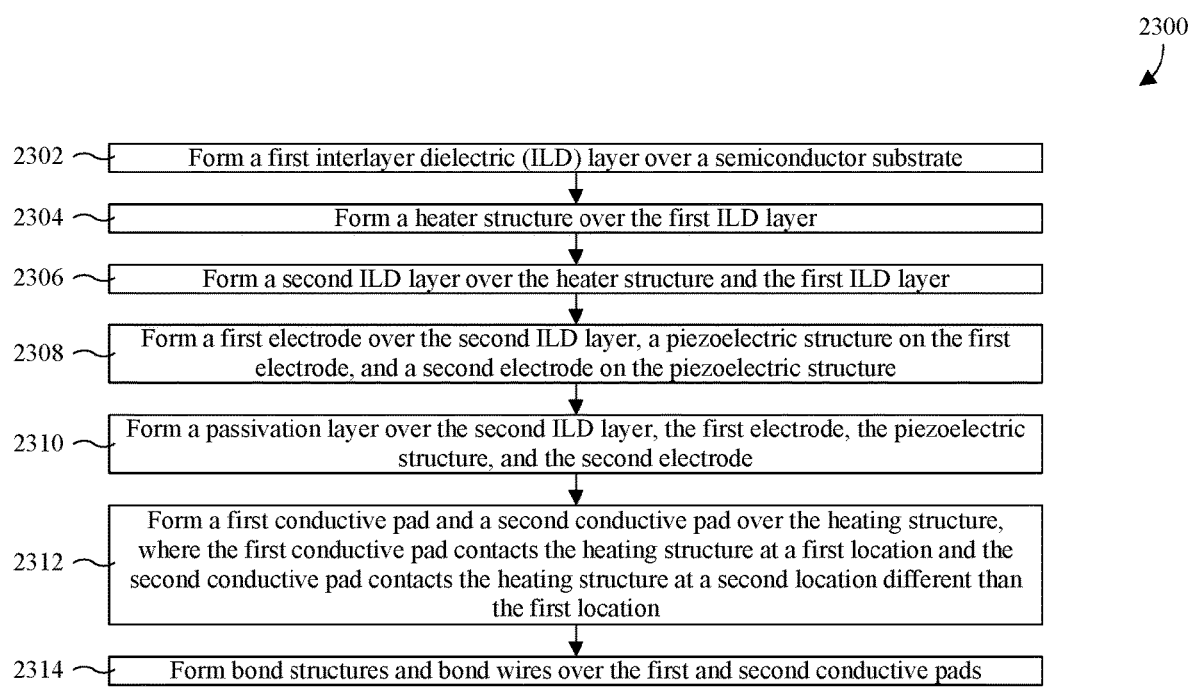
FIG. 23 illustrates a flowchart of some embodiments of a method for forming a piezoelectric device configured to recover a degraded performance characteristic of the piezoelectric device.

As illustrated in FIG. 23, a flowchart 2300 of some embodiments of a method for forming a piezoelectric device configured to recover a degraded performance characteristic of the piezoelectric device is provided. While the flowchart 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2302, a first interlayer dielectric (ILD) layer is formed over a semiconductor substrate. FIG. 13 illustrates a cross-sectional view of some embodiments corresponding to act 2302.

At act 2304, a heater structure is formed over the first ILD layer. FIG. 14 illustrates a cross-sectional view of some embodiments corresponding to act 2304.

At act 2306, a second ILD layer is formed over the heater structure and the first ILD layer. FIG. 15 illustrates a cross-sectional view of some embodiments corresponding to act 2306.

At act 2308, a first electrode is formed over the second ILD layer, a piezoelectric structure is formed over the first electrode, and a second electrode is formed over the piezoelectric structure. FIGS. 16-18 illustrate a series of cross-sectional views of some embodiments corresponding to act 2308.

At act 2310, a passivation layer is formed over the second ILD layer, the first electrode, the piezoelectric structure, and the second electrode. FIGS. 19-20 illustrate a series of cross-sectional views of some embodiments corresponding to act 2310.

At act 2312, a first conductive pad and a second conductive pad are formed over the heating structure, where the first conductive pad contacts the heating structure at a first location and the second conductive pad contacts the heating structure at a second location different than the first location. FIG. 21 illustrates a cross-sectional view of some embodiments corresponding to act 2312.

At act 2314, bond structures and bond wires are formed over the first and second conductive pads. FIG. 22 illustrates a cross-sectional view of some embodiments corresponding to act 2314.

In some embodiments, the present application provides a piezoelectric device. The piezoelectric device comprises a semiconductor substrate. A first electrode is disposed over the semiconductor substrate. A piezoelectric structure is disposed on the first electrode. A second electrode is disposed on the piezoelectric structure. A heating element is disposed over the semiconductor substrate. The heating element is configured to heat the piezoelectric structure to a recovery temperature for a period of time, where heating the piezoelectric structure to the recovery temperature for the period of time improves a degraded electrical property of the piezoelectric device.

In other embodiments, the present application provides a method for recovering degraded device performance of a piezoelectric device. The method comprises operating a piezoelectric device in an actuation mode a first time, where the piezoelectric device comprises a piezoelectric structure disposed over a semiconductor substrate. A performance characteristic of the piezoelectric device is determined to have degraded from a first value to a second value. A recovery mode operation is performed on the piezoelectric device, where the recovery mode operation comprises heating the piezoelectric structure to a recovery temperature. The piezoelectric device is operated in the actuation mode a second time after the recovery mode operation has been performed, where when operating the piezoelectric device in the actuation mode the second time, the performance characteristic of the piezoelectric device has a third value that is closer to the first value than the second value is to the first value.

In yet other embodiments, the present application provides a system. The system comprises a piezoelectric device disposed on a semiconductor substrate. The piezoelectric device comprises a piezoelectric structure disposed between a first electrode and a second electrode. Measurement circuitry is electrically coupled to the piezoelectric device. The measurement circuitry is configured to determine whether a performance characteristic of the piezoelectric device has degraded from a first value to a second value. Bias circuitry is electrically coupled to a heating element that is disposed over the semiconductor substrate. The bias circuitry is configured to perform a recovery mode operation on the piezoelectric device, where the recovery mode operation improves the performance characteristic from the second value to a third value that is closer to the first value than the second value is to the first value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A piezoelectric device, comprising:
a semiconductor substrate;
a first electrode disposed over the semiconductor substrate;
a piezoelectric structure disposed on the first electrode;
a second electrode disposed on the piezoelectric structure; and
a heating element disposed over the semiconductor substrate, the heating element configured to heat the piezoelectric structure to a recovery temperature for a period of time, wherein the recovery temperature is greater than or equal to a Curie temperature of the piezoelectric structure, and wherein heating the piezoelectric structure to the recovery temperature for the period of time improves a degraded electrical property of the piezoelectric device.

2. The piezoelectric device of claim 1, further comprising:
a first conductive pad disposed on the heating element, the first conductive pad electrically coupled to the heating element; and
a second conductive pad disposed on the heating element, the second conductive pad electrically coupled to the heating element.

3. The piezoelectric device of claim 1, further comprising:
a heating structure disposed over the second electrode, the heating structure extending from above the second electrode toward the semiconductor substrate on opposite sides of the second electrode, opposite sides of the piezoelectric structure, and opposite sides of the second electrode, wherein the heating structure is the heating element.

4. The piezoelectric device of claim 3, further comprising:
a first passivation layer disposed over the first electrode, the first passivation layer extending from above the first electrode toward the semiconductor substrate along opposite sidewalls of the first electrode, opposite sidewalls of the piezoelectric structure, and opposite sidewalls of the second electrode, wherein the first passivation layer separates the heating structure from the first electrode, the piezoelectric structure, and the second electrode.

5. The piezoelectric device of claim 4, further comprising:
a second passivation layer disposed over the heating structure, wherein the second passivation layer extends from above the heating structure toward the semiconductor substrate along opposite sidewalls of the heating structure.

6. The piezoelectric device of claim 1, further comprising:
a heating structure disposed beneath the first electrode; and
an interlayer dielectric (ILD) layer disposed between the heating structure and the first electrode.

7. The piezoelectric device of claim 6, further comprising:
a first conductive pad disposed over the ILD layer, wherein the first conductive pad extends through the ILD layer to contact the heating structure at a first location that is disposed on a first side of the first electrode; and
a second conductive pad disposed over the ILD layer, wherein the second conductive pad extends through the ILD layer to contact the heating structure at a second location that is disposed on a second side of the first electrode opposite the first side.

8. The piezoelectric device of claim 2, wherein the heating element extends from a first outermost sidewall of the second electrode to a second outermost sidewall of the second electrode, the second outermost sidewall being opposite the first outermost sidewall, and wherein the first conductive pad extends to an elevation level with a bottommost surface of the first electrode.

9. The piezoelectric device of claim 8, wherein a dielectric layer spaces the heating element from the second electrode, and wherein the dielectric layer conforms to a top surface and outermost sidewalls of the second electrode.

10. The piezoelectric device of claim 2, wherein the heating element is configured to heat the piezoelectric structure to the recovery temperature by passing a current from the first conductive pad to the second conductive pad through the heating element, wherein the first conductive pad overhangs a first outermost sidewall of the heating element, and wherein the second conductive pad overhangs a second outermost sidewall of the heating element opposite the first outermost sidewall.

11. A system, the system comprising:
a piezoelectric device disposed on a semiconductor substrate, the piezoelectric device comprising a piezoelectric structure disposed between a first electrode and a second electrode;
measurement circuitry electrically coupled to the piezoelectric device, the measurement circuitry configured to determine whether a polarization characteristic or a piezo-actuation performance of the piezoelectric device has degraded from a first value to a second value; and
bias circuitry electrically coupled to a heating element that is disposed over the semiconductor substrate, the bias circuitry configured to perform a first recovery mode operation on the piezoelectric device when the polarization characteristic or the piezo-actuation performance has degraded from the first value to the second value, wherein the first recovery mode operation is configured to improve the polarization characteristic or the piezo-actuation performance from the second value to a third value that is closer to the first value than the second value is to the first value.

12. The system of claim 11, further comprising:
a current source electrically coupled to the heating element via a first conductive pad; and
a switching element electrically coupled to the heating element via a second conductive pad different than the first conductive pad.

13. The system of claim 11, wherein the first recovery mode operation further comprises:
actuating a switch at a beginning of the first recovery mode operation to a closed state, providing a conductive path for a first current through the heating element to the bias circuitry; and
actuating the switch at an end of the first recovery mode operation to an open state, removing the conductive path through the heating element to the bias circuitry.

14. The system of claim 11, wherein a first current passing through the heating element heats the heating element to a recovery temperature, and wherein the recovery temperature is greater than or equal to a Curie temperature of the piezoelectric structure.

15. The system of claim 11, wherein the heating element extends from a first outer sidewall of the piezoelectric structure to a second outer sidewall of the piezoelectric structure opposite the first outer sidewall, and wherein the first recovery mode operation comprises passing a current from a first contact extending beyond the first outer sidewall, through the heating element, and to a second contact extending beyond the second outer sidewall.

16. A piezoelectric device, comprising:
a semiconductor substrate;
a piezoelectric structure disposed over the semiconductor substrate and vertically between a first electrode and a second electrode;
a heating structure disposed over the semiconductor substrate, wherein the heating structure is spaced from each of the first electrode, the piezoelectric structure, and the second electrode, and wherein the heating structure is configured to heat the piezoelectric structure to a recovery temperature for a period of time;
a first passivation layer disposed over the first electrode, the piezoelectric structure, and the second electrode, wherein the first passivation layer extends along sidewalls of the first electrode, the piezoelectric structure, and the second electrode;

a first conductive pad disposed over the semiconductor substrate and electrically coupled to the first electrode, wherein the first conductive pad extends vertically through the first passivation layer to contact the first electrode at a first location;

a second conductive pad disposed over the semiconductor substrate and electrically coupled to the second electrode, wherein the second conductive pad extends vertically through the first passivation layer to contact the second electrode at a second location that is spaced from the first location;

a third conductive pad disposed over the semiconductor substrate and electrically coupled to the heating structure, wherein the third conductive pad contacts the heating structure at a third location, and wherein the third location is spaced from both the first location and the second location; and a fourth conductive pad disposed over the semiconductor substrate and electrically coupled to the heating structure, wherein the fourth conductive pad contacts the heating structure at a fourth location, and wherein the fourth location is spaced from each of the first location, the second location, and the third location.

17. The piezoelectric device of claim 16, wherein the third conductive pad is spaced from the fourth conductive pad by the piezoelectric structure and the heating structure, and the third conductive pad does not contact the fourth conductive pad.

18. The piezoelectric device of claim 16, wherein the heating structure is configured to heat the piezoelectric structure to the recovery temperature by passing a current from the third conductive pad to the fourth conductive pad through the heating structure.

19. The piezoelectric device of claim 16, wherein:

the first location and the second location are both disposed within a perimeter of the first electrode;

the third location and the fourth location are both disposed outside the perimeter of the first electrode; and the third location and the fourth location are both disposed outside a perimeter of the second electrode.

20. The piezoelectric device of claim 19, further comprising:

a second passivation layer overlying the heating structure, wherein the second passivation layer extends vertically along sidewalls of the heating structure, wherein the heating structure is disposed vertically between the second passivation layer and the first passivation layer, wherein the third conductive pad extends vertically through the second passivation layer to contact the heating structure at the third location, and wherein the fourth conductive pad extends vertically through the second passivation layer to contact the heating structure at the fourth location.

\* \* \* \* \*